(12) United States Patent
Morimoto et al.

(10) Patent No.: US 9,947,864 B2
(45) Date of Patent: Apr. 17, 2018

(54) METHOD FOR ETCHING OBJECT TO BE PROCESSED

(71) Applicant: TOKYO ELECTRON LIMITED, Tokyo (JP)

(72) Inventors: Tamotsu Morimoto, Nirasaki (JP); Song yun Kang, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/327,434

(22) PCT Filed: Aug. 6, 2015

(86) PCT No.: PCT/JP2015/072378
§ 371 (c)(1),
(2) Date: Jan. 19, 2017

(87) PCT Pub. No.: WO2016/031520
PCT Pub. Date: Mar. 3, 2016

(65) Prior Publication Data
US 2017/0200886 A1  Jul. 13, 2017

(30) Foreign Application Priority Data
Aug. 26, 2014 (JP) .................. 2014-171686

(51) Int. Cl.
*H01L 43/12* (2006.01)
*H01L 43/00* (2006.01)
(Continued)

(52) U.S. Cl.
CPC .............. *H01L 43/12* (2013.01); *H01L 43/00* (2013.01); *H01L 43/08* (2013.01); *H01L 43/10* (2013.01)

(58) Field of Classification Search
CPC ......... H01L 43/00; H01L 43/08; H01L 43/10; H01L 43/12
See application file for complete search history.

(56) References Cited

U.S. PATENT DOCUMENTS

2004/0253786 A1* 12/2004 Hwang .................. B82Y 10/00
                                                            438/257
2006/0154487 A1*  7/2006 Wang ................ H01L 21/31116
                                                            438/714
(Continued)

FOREIGN PATENT DOCUMENTS

JP       2011-014881 A    1/2011
JP       2013-089857 A    5/2013

OTHER PUBLICATIONS

International Search Report issued in PCT/JP2015/072378; dated Sep. 8, 2015.

*Primary Examiner* — Phat X Cao
(74) *Attorney, Agent, or Firm* — Studebaker & Brackett PC

(57) ABSTRACT

In one embodiment, a method for etching a workpiece including a lower electrode and a multi-layer film disposed on the lower electrode, the multi-layer film including a first magnetic layer, a second magnetic layer, and an insulating layer interposed between the first magnetic layer and the second magnetic layer, through a mask, is provided. The method includes exposing the workpiece to plasma of first processing gas which contains first rare gas and second rare gas having an atomic number larger than that of the first rare gas, and does not contain hydrogen gas.

12 Claims, 6 Drawing Sheets

(51) Int. Cl.
*H01L 43/08* (2006.01)
*H01L 43/10* (2006.01)

(56) References Cited

U.S. PATENT DOCUMENTS

| | | | |
|---|---|---|---|
| 2007/0190683 A1* | 8/2007 | Bae | H01L 45/06 |
| | | | 438/95 |
| 2010/0301008 A1* | 12/2010 | Shinde | C23F 4/00 |
| | | | 216/22 |
| 2010/0328823 A1* | 12/2010 | Chen | G01R 33/098 |
| | | | 360/324.12 |

* cited by examiner

METHOD FOR ETCHING OBJECT TO BE PROCESSED

TECHNICAL FIELD

Embodiments of the present invention relate to a method for etching a workpiece.

BACKGROUND ART

A magnetic random access memory (MRAM) element having a magnetic tunnel junction (MTJ) structure has attracted attention as one type of a memory element using a magnetoresistance effect element.

The MRAM element includes a multi-layer film configured of a hard-to-etch material such as a transition metal or a magnetic body. In manufacturing of such an MRAM element, for example, a platinum manganese (PtMn) layer is etched by using a mask containing tantalum (Ta). It is desirable that a shape to be formed by the etching has high verticality. In Patent Literature 1 described below, it is described that the platinum manganese layer is subjected to dry etching by generating plasma of etching gas containing hydrogen gas, carbon dioxide gas, methane gas and rare gas by using a tantalum layer as a mask. IN a method described in Patent Literature 1, the etching is performed while removing a deposition substance formed on the surface of the platinum manganese layer by the plasma of hydrogen contained in the etching gas, and thus, it is possible to process the platinum manganese layer with high verticality.

CITATION LIST

Patent Literature

[Patent Literature 1] Japanese Unexamined Patent Publication No. 2013-89857

SUMMARY OF INVENTION

Technical Problem

The present inventors have found that in a case where the hydrogen gas is contained in the etching gas as the method described in Patent Literature 1, electric properties of the multi-layer film, specifically, an MR rate of the manufactured MRAM element deteriorates. It is assumed that the deterioration in the electric properties is caused by damaging a joint surface of the multi-layer film due to a hydrogen ion or a hydrogen atom which is generated by excitation of the etching gas.

Therefore, in this technical field, an etching method has been required in which it is possible to improve verticality of a side wall surface of the multi-layer film while suppressing the deterioration in the electric properties of the multi-layer film.

Solution to Problem

In one aspect, a method for etching a workpiece including a lower electrode and a multi-layer film disposed on the lower electrode, the multi-layer film including a first magnetic layer, a second magnetic layer and an insulating layer interposed between the first magnetic layer and the second magnetic layer, through a mask, is provided. The method includes exposing the workpiece to plasma of first processing gas which contains first rare gas and second rare gas having an atomic number larger than that of the first rare gas, and does not contain hydrogen gas.

In the method according to the aspect, the workpiece is etched by the plasma of the first processing gas which contains the first rare gas and the second rare gas, and does not contain the hydrogen gas. In the first processing gas, the hydrogen gas is not contained, and thus, it is possible to prevent a joint surface of the multi-layer film from being damaged due to a hydrogen ion. As a result thereof, it is possible to suppress deterioration in electric properties of the multi-layer film. In addition, an atom of the first rare gas having relatively small atomic number modifies each layer configuring the multi-layer film to be easily etched. The modified multi-layer film can be easily etched by the second rare gas having an atomic number larger than that of the first rare gas. Therefore, in the method according to the aspect, it is possible to improve verticality a side wall surface of the multi-layer film after being etched.

The method according to one embodiment may further include exposing the workpiece to plasma of second processing gas which contains helium and neon, said exposing the workpiece to plasma of second processing gas being performed after the multi-layer film is etched and a surface of the lower electrode is exposed by said exposing the workpiece to the plasma of the first processing gas. In the etching of the multi-layer film, over etching is performed in order to decrease the width (a critical dimension (CD)) of the multi-layer film. In the over etching, it is desirable to maintain a film thickness of the mask on the multi-layer film. The helium and the neon contained in the second processing gas are comparatively light rare gas, and thus, have a low etching efficiency with respect to the mask. On the other hand, a magnetic body configuring the multi-layer film can be etched by the plasma of the helium and the neon. That is, it is possible to increase an etching selectivity of the multi-layer film with respect to the mask by using the plasma containing the helium and the neon. As a result thereof, it is possible to decrease the width of the multi-layer film while maintaining the film thickness of the mask.

In one embodiment, the first processing gas and the second processing gas may further contain methane gas. Accordingly, it is possible to further improve the verticality of the multi-layer film after being etched. In addition, in one embodiment, the multi-layer film may further include a pinning layer which is disposed between the lower electrode and the first magnetic layer.

In one embodiment, the first magnetic layer and the second magnetic layer may be configured of CoFeB, the insulating layer may be configured of MgO, and the pinning layer may be configured of CoPt.

In one embodiment, the first rare gas may be helium or neon, and the second rare gas may be any one of argon, krypton, and xenon. In addition, the first rare gas may be helium, and the second rare gas may be krypton.

Advantageous Effects of Invention

According to the aspect and embodiments of the present invention, it is possible to improve verticality of a side wall surface of a multi-layer film while suppressing deterioration in electric properties of the multi-layer film.

DESCRIPTION OF EMBODIMENTS

Figure 1:
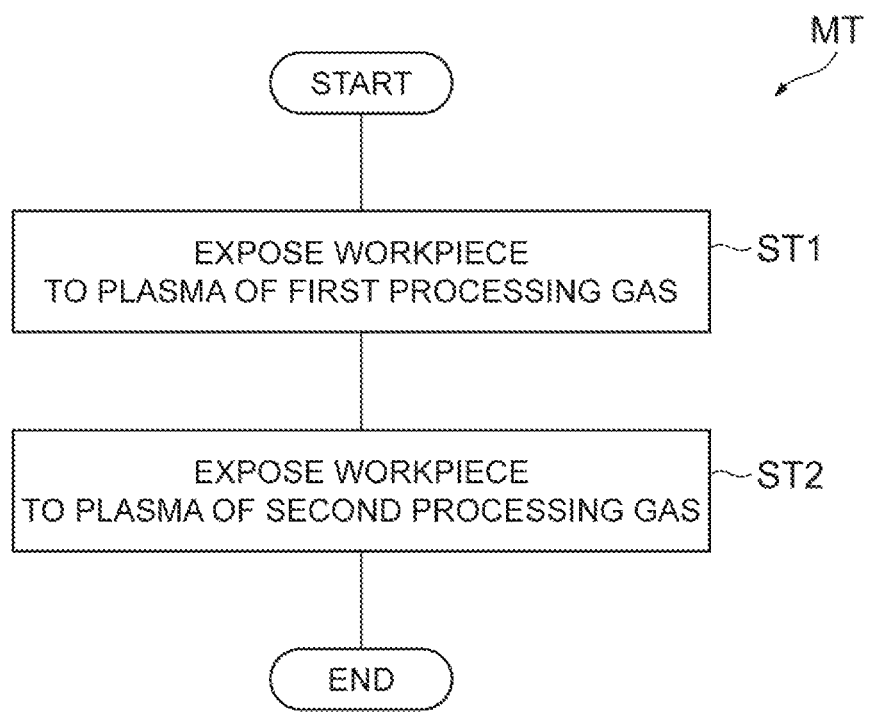
FIG. 1 is a flow chart illustrating one embodiment of a method for etching a workpiece.

Hereinafter, various embodiments will be described in detail with reference to the drawings. Furthermore, in the drawings, the same reference symbols are applied to the same portions or the corresponding portions, and the repeated description thereof will be omitted.

FIG. 1 is a flow chart illustrating one embodiment of a method for etching a workpiece. In the method for etching a workpiece of one embodiment, a workpiece including a lower electrode and a multi-layer film which includes a first magnetic layer, a second magnetic layer and an insulating layer interposed between the first magnetic layer and the second magnetic layer is etched through a mask. A method MT illustrated in FIG. 1 includes a step ST1 and a step ST2. The method MT is performed by using a plasma processing apparatus. Hereinafter, the plasma processing apparatus which can be used for performing the method MT will be described.

Figure 2:
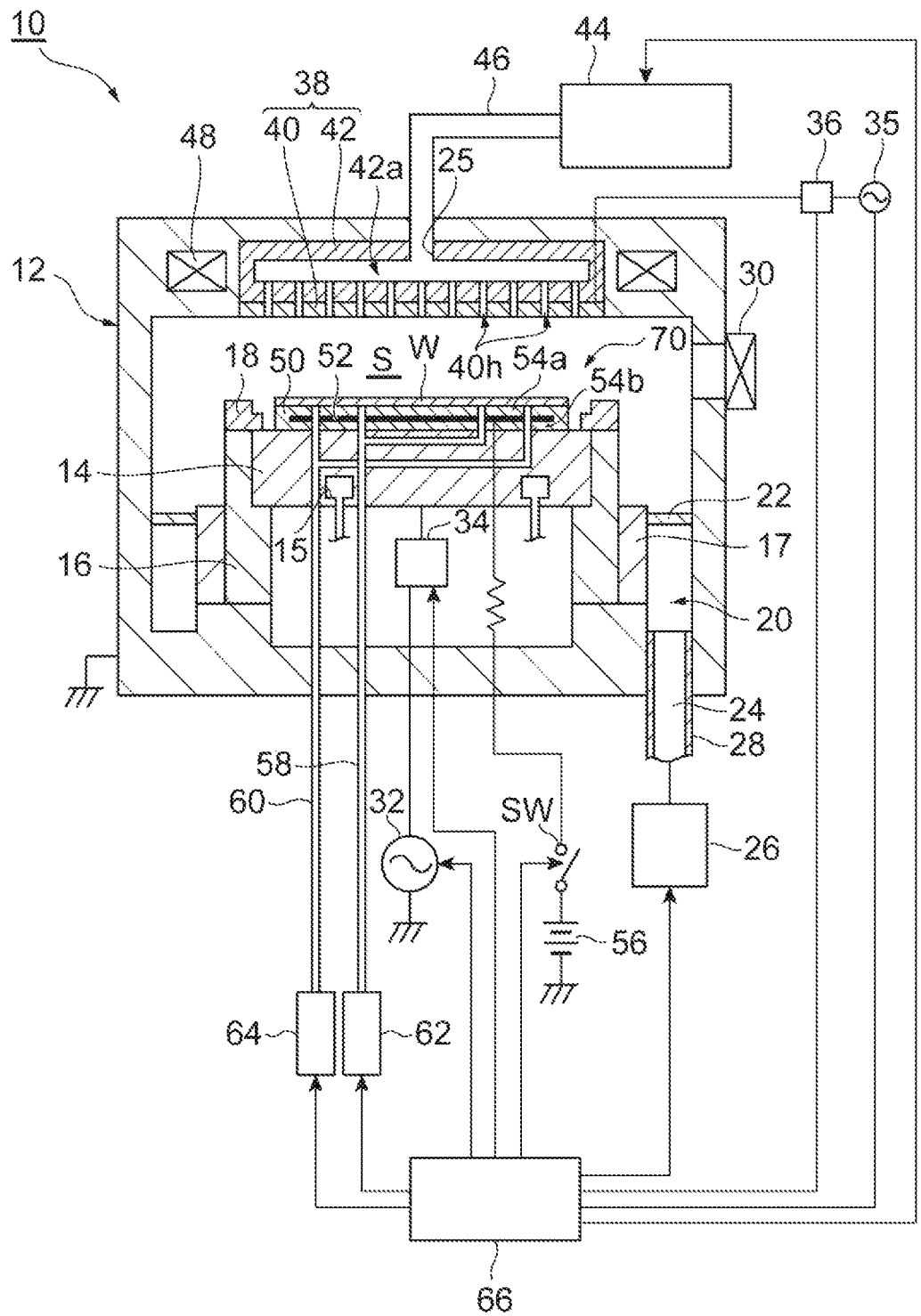
FIG. 2 is a diagram illustrating an example of a plasma processing apparatus.

FIG. 2 is a diagram illustrating an example of the plasma processing apparatus. A plasma processing apparatus 10 illustrated in FIG. 2 is a capacitive coupling plasma processing apparatus. Furthermore, an arbitrary plasma processing apparatus such as an inductive coupling plasma processing apparatus and a plasma processing apparatus using a surface wave such as a microwave can be used for performing the method MT.

As illustrated in FIG. 2, the plasma processing apparatus 10 includes a processing container 12. The processing container 12 is approximately in the shape of a cylinder, and a processing space S is defined as an inner space. The plasma processing apparatus 10 includes a base 14 which is approximately in the shape of a disk in the processing container 12. The base 14 is disposed under the processing space S. The base 14, for example, is formed of aluminum and configures the lower electrode. The base 14 has a function of absorbing the heat of an electrostatic chuck 50 described below and cooling the electrostatic chuck 50 in a process.

A coolant flow passage 15 is formed in the base 14, and a coolant inlet pipe and a coolant outlet pipe are connected to the coolant flow passage 15. In the plasma processing apparatus 10, a suitable coolant, for example, cooling water and the like are circulated in the coolant flow passage 15. Accordingly, the base 14 and the electrostatic chuck 50 are controlled such that a predetermined temperature is obtained.

In addition, the plasma processing apparatus 10 further includes a cylindrical holding portion 16 and a cylindrical supporting portion 17. The cylindrical holding portion 16 is in contact with an edge portion of the side surface and the bottom surface of the base 14, and holds the base 14. The cylindrical supporting portion 17 extends to a perpendicular direction from a bottom portion of the processing container 12, and supports the base 14 through the cylindrical holding portion 16. The plasma processing apparatus 10 further includes a focus ring 18 which is disposed on the upper surface of the cylindrical holding portion 16. The focus ring 18, for example, can be configured of silicon or quartz.

In one embodiment, an exhaust passage 20 is formed between the side wall of the processing container 12 and the cylindrical supporting portion 17. A baffle plate 22 is attached to an inlet of the exhaust passage 20 or to the middle thereof. In addition, an exhaust port 24 is disposed in a bottom portion of the exhaust passage 20. The exhaust port 24 is defined by an exhaust pipe 28 which is fitted into the bottom portion of the processing container 12. An exhaust device 26 is connected to the exhaust pipe 28. The exhaust device 26 includes a vacuum pump, and can be reduce the pressure of the processing space S in the processing container 12 to a predetermined degree of vacuum. A gate valve 30 which opens and closes a carrying in/out port of a workpiece W is attached to the side wall of the processing container 12.

A high frequency power source 32 for ion drawing is electrically connected to the base 14 through a matching device 34. The high frequency power source 32 applies a high frequency power suitable for ion drawing, for example, high frequency bias power of 400 KHz to the lower electrode, that is, the base 14.

The plasma processing apparatus 10 further includes a shower head 38. The shower head 38 is disposed above the processing space S. The shower head 38 includes an electrode plate 40 and an electrode support 42.

The electrode plate 40 is a conductive plate which is approximately in the shape of a disk, and configures an upper electrode. A high frequency power source 35 for generating plasma is electrically connected to the electrode plate 40 through a matching device 36. The high frequency power source 35 supplies a high frequency power for generating plasma, for example, high frequency power of 60 MHz to the electrode plate 40. In a case where high frequency power is applied to the electrode plate 40 by the high frequency power source 35, high frequency electric field is formed in a space between the base 14 and the electrode plate 40, that is, the processing space S.

A plurality of gas passing holes 40h are formed in the electrode plate 40. The electrode plate 40 is detachably supported by the electrode support 42. A buffer chamber 42a is provided in the electrode support 42. The plasma processing apparatus 10 further includes a gas supply portion 44, and the gas supply portion 44 is connected to a gas introduction port 25 of the buffer chamber 42a through a gas supply conduit 46. The gas supply portion 44 supplies processing gas to the processing space S. The gas supply portion 44 can supply a plurality of types of gas. In one embodiment, the gas supply portion 44 can supply first processing gas, second processing gas, and methane gas. The first processing gas contains first rare gas and second rare gas, and does not contain hydrogen gas. The second processing gas is gas containing helium and neon. In one embodiment, the first processing gas and the second processing gas may further contain methane.

A plurality of holes which are respectively continued to the plurality of gas passing holes 40h are formed in the electrode support 42, and the plurality of holes are communicated with the buffer chamber 42a. Therefore, gas supplied from the gas supply portion 44 is supplied to the processing space S through the buffer chamber 42a and the gas passing holes 40h.

In addition, a magnetic field formation mechanism 48 which annularly or coaxially extends is disposed in a ceiling portion of the processing container 12 of the plasma processing apparatus 10. The magnetic field formation mechanism 48 functions such that high frequency discharge of the processing space S easily starts (plasma ignition), and the discharge is stably maintained.

In addition, the electrostatic chuck 50 is disposed on the upper surface of the base 14. The electrostatic chuck 50 includes an electrode 52, and a pair of insulating films 54a and 54b. The insulating films 54a and 54b are films which are formed of an insulator such as ceramic. The electrode 52 is a conductive film, and is disposed between the insulating film 54a and the insulating film 54b. A direct current power source 56 is connected to the electrode 52 through a switch SW. When a direct current voltage is applied to the electrode 52 from the direct current power source 56, a coulomb force is generated, and the workpiece W is attracted and held on the electrostatic chuck 50 by the coulomb force. In addition, a heater, which is a heating element, is embedded in the electrostatic chuck 50, and the workpiece W can be heated to a predetermined temperature. The heater is connected to a heater power source through wiring.

The plasma processing apparatus 10 further includes gas supply lines 58 and 60, and heat transfer gas supply portions 62 and 64. The heat transfer gas supply portion 62 is connected to the gas supply line 58. The gas supply line 58 extends to the upper surface of the electrostatic chuck 50, and annularly extends in the center portion of the upper surface. The heat transfer gas supply portion 62, for example, supplies heat transfer gas such as He gas between the upper surface of the electrostatic chuck 50 and the workpiece W. In addition, the heat transfer gas supply portion 64 is connected to the gas supply line 60. The gas supply line 60 extends to the upper surface of the electrostatic chuck 50, and annularly extends in the upper surface such that the gas supply line 60 surrounds the gas supply line 58. The heat transfer gas supply portion 64, for example, supplies heat transfer gas such as He gas between the upper surface of the electrostatic chuck 50 and the workpiece W.

In addition, the plasma processing apparatus 10 further includes a control unit 66. The control unit 66 is connected to the exhaust device 26, the switch SW, the high frequency power source 32, the matching device 34, the high frequency power source 35, the matching device 36, the gas supply portion 44, and the heat transfer gas supply portions 62 and 64. The control unit 66 transmits a control signal to each of the exhaust device 26, the switch SW, the high frequency power source 32, the matching device 34, the high frequency power source 35, the matching device 36, the gas supply portion 44, and the heat transfer gas supply portions 62 and 64. The exhaustion of the exhaust device 26, the opening and closing of the switch SW, the supply of the high frequency bias power from the high frequency power source 32, the impedance adjustment of the matching device 34, the supply of the high frequency power from the high frequency power source 35, the impedance adjustment of the matching device 36, the supply of the processing gas from the gas supply portion 44, and the supply of the heat transfer gas from each of the heat transfer gas supply portions 62 and 64 are controlled by the control signal from the control unit 66.

The plasma processing apparatus 10 can selectively supply the first processing gas and the second processing gas to the processing space S from the gas supply portion 44. In addition, when a high frequency electric field is formed between the electrode plate 40 and the base 14, that is, in the processing space S, in a state where the processing gas such as the first processing gas and the second processing gas is supplied to the processing space S, plasma is generated in the processing space S. The etched layer of the workpiece W is etched by active species of an element contained in the processing gas.

Figure 3:
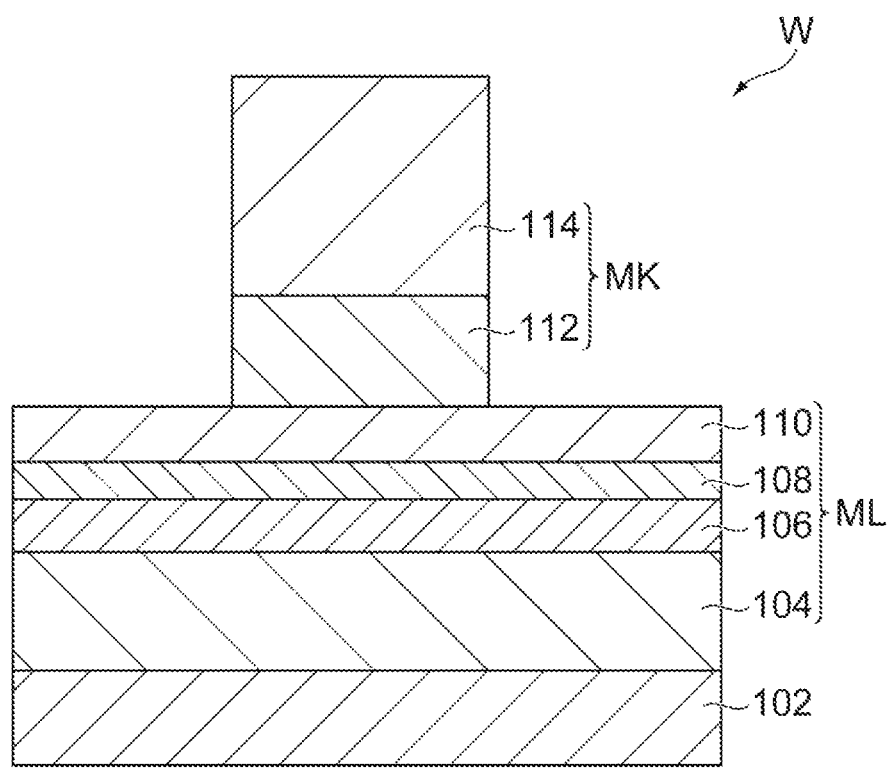
FIG. 3 is a diagram illustrating an example of a workpiece to which a method MT is applied.

The method MT will be described again. First, the workpiece to which the method MT is applied will be described. FIG. 3 is a diagram illustrating an example of the workpiece to which the method MT is applied. The workpiece W illustrated in FIG. 3 is a product which can be obtained in the middle of manufacturing an MRAM element having an MTJ structure.

The workpiece W illustrated in FIG. 3 includes a lower electrode 102, a multi-layer film ML, an upper electrode 112, and an upper layer 114. The lower electrode 102 is an electrode configured of a conductive material, and also functions as a base layer for laminating each layer thereon. The lower electrode 102, for example, can have a laminated structure in which a tantalum (Ta) film, a ruthenium (Ru) film, and a tantalum film are laminated in this order.

The multi-layer film ML is disposed on the lower electrode 102, and includes a pinning layer 104, a first magnetic layer 106, an insulating layer 108, and a second magnetic layer 110. The multi-layer film ML has an MTJ structure in which an insulator is disposed between a pair of ferromagnetic bodies. The pinning layer 104 is disposed between the lower electrode 102 and the first magnetic layer 106, and is configured of an antiferromagnetic body material such as cobalt platinum (CoPt) and platinum manganese (PtMn). The pinning layer 104 functions as a pinning layer which fixes a magnetization direction of the first magnetic layer 106 by a pinning effect of an antiferromagnetic body.

The first magnetic layer 106 is disposed on the pinning layer 104, and is configured of a ferromagnetic body material. The magnetization direction of the first magnetic layer 106 is constantly held according to a pinning effect of the pinning layer 104 without being affected by an external magnetic field. The first magnetic layer 106, for example, is configured of CoFeB.

The insulating layer 108 is disposed between the first magnetic layer 106 and the second magnetic layer 110. The insulating layer 108 is interposed between the first magnetic layer 106 and the second magnetic layer 110, and thus, a tunnel magnetoresistance effect occurs between the first magnetic layer 106 and the second magnetic layer 110. That is, electric resistance according to a relative relationship (parallel or antiparallel) between the magnetization direction of the first magnetic layer 106 and a magnetization direction of the second magnetic layer 110 is generated between the first magnetic layer 106 and the second magnetic layer 110. The insulating layer 108, for example, is configured of MgO.

The second magnetic layer 110 is disposed on the insulating layer 108, and is configured of a ferromagnetic body material. The second magnetic layer 110 functions as a so-called free layer, in which a magnetization direction follows an external magnetic field. The second magnetic layer 110, for example, is configured of CoFeB.

The upper electrode 112 is an electrode configured of a conductive material, and is disposed on the second magnetic layer 110. The upper electrode 112, for example, can have a laminated structure in which a tantalum film and a ruthenium film are laminated in this order. The upper layer 114 is disposed on the upper electrode 112. The upper layer 114, for example, is configured of tantalum. In an application example of the method MT, a laminated structure formed of the upper electrode 112 and the upper layer 114 becomes a mask MK, and the multi-layer film ML is etched.

Returning to FIG. 1, first, in the method MT, the step ST1 is performed. In the step ST1, the workpiece W is exposed to plasma of the first processing gas. Accordingly, the multi-layer film ML is etched through the mask MK. The first processing gas is gas which contains the first rare gas and the second rare gas, and does not contain the hydrogen gas. The second rare gas contained in the first processing gas is rare gas having an atomic number larger than an atomic number of the first rare gas. For example, when the first rare gas is helium (He), any one of neon (Ne), argon (Ar), krypton (Kr), and xenon (Xe) can be used as the second rare gas. In addition, when the first rare gas is neon, any one of argon, krypton, and xenon can be used as the second rare gas. Furthermore, in one embodiment, the first rare gas may be helium or neon, and the second rare gas may be any one of argon, krypton, and xenon. In particular, the first rare gas may be helium, and the second rare gas may be krypton. In addition, in one embodiment, the first processing gas can further contain methane gas.

Figure 4:
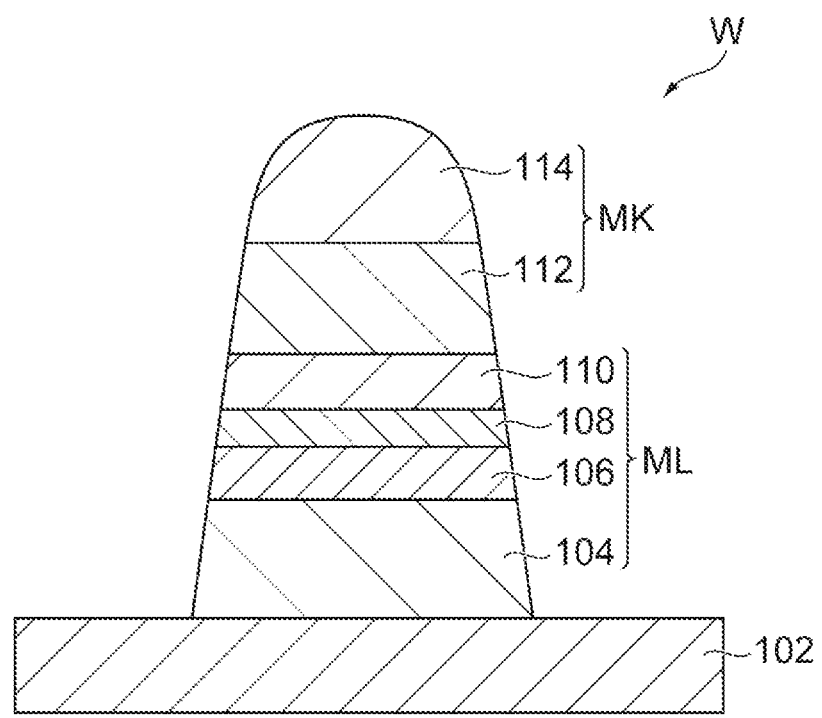
FIG. 4 is a diagram illustrating an example of the workpiece after being subjected to a step ST2 of the method MT.

In the step ST1, active species of the first rare gas contained in the first processing gas modifies the multi-layer film ML to be easily etched. The mechanism of the modification is not apparent, but it is assumed that a part of a molecular bond of the multi-layer film ML is broken by the active species of the first rare gas, and thus, the multi-layer film ML is transformed into a state of being easily etched. In addition, in the step ST1, the modified multi-layer film ML is removed by the active species of the second rare gas contained in the first processing gas. The second rare gas is an atom of comparatively heavy rare gas, and thus can remove the modified multi-layer film ML with a high sputtering efficiency, that is, with a high etching efficiency. The step ST1 is performed until the surface of the lower electrode 102 is exposed. According to the step ST1 of the method MT, it is possible to remove the multi-layer film ML with a high etching efficiency, and thus, it is possible to increase verticality of the multi-layer film ML after being subjected to etching processing. An example of the workpiece W after the multi-layer film ML is etched by the step ST1 is illustrated in FIG. 4.

In a case where the surface of the lower electrode 102 is exposed by the step ST1, then, the step ST2 is performed. In the step ST2, the workpiece W is exposed to plasma of the second processing gas. The second processing gas is gas containing helium and neon. The helium and the neon have a small atomic number, and are light rare gas, and thus, have a low sputtering efficiency, that is, a low etching efficiency with respect to the mask MK. In particular, in a case where the upper layer 114 is configured of tantalum, an etching efficiency of the upper layer 114 is extremely low. On the other hand, a transition metal or a magnetic body can be removed by an active species of the helium and the neon. Therefore, in the step ST2, it is possible to remove a portion of the multi-layer film ML which is not positioned under the mask MK while maintaining a film thickness of the mask MK. Accordingly, it is possible to decrease the width of the multi-layer film ML. In addition, according to the step ST2, it is possible to improve verticality of a side wall surface of the multi-layer film ML by removing a lower portion of the side wall surface of the multi-layer film ML.

Hereinafter, effectiveness of the method MT will be described on the basis of test examples and a comparative test example, but the present invention is not limited to the test examples described below. Furthermore, test results described below are obtained by performing etching using the plasma processing apparatus 10 with respect to the workpiece W illustrated in FIG. 3. Hereinafter, a multi-layer film, in which a tantalum film, a ruthenium film, and a tantalum film were laminated in this order, was used as the lower electrode 102. In addition, a CoPt film was used as the pinning layer 104. A CoFeB film was used as the first magnetic layer 106 and the second magnetic layer 110. A multi-layer film, in which a tantalum film and a ruthenium film were laminated in this order, was used as the upper electrode 112. A tantalum film was used as the upper layer 114.

[Evaluation of Verticality of Etching]

First, effectiveness of the step ST1 of the method MT was evaluated. In Test Example 1, the multi-layer film ML was etched through the mask MK by using the plasma of the first processing gas. In Comparative Test Example 1, the multi-layer film ML was etched through the mask MK by using plasma of nitrogen ($N_2$) gas and neon gas. Then, the verticality of the side wall surface of the multi-layer film ML etched in Test Example 1 and Comparative Test Example 1 was evaluated. Processing conditions of Test Example 1 and Comparative Test Example 1 were as follows.

(Processing Conditions of Test Example 1)
Pressure in Processing container 12: 10 mTorr (1.333 Pa)
High Frequency Power for Generating Plasma: 200 W
High Frequency Bias Power: 800 W
Flow Rate of Krypton Gas: 85 sccm
Flow Rate of Methane Gas: 15 sccm
Flow Rate of Helium Gas: 100 sccm
Temperature of Workpiece: 10° C.

(Processing Conditions of Comparative Test Example 1)
Pressure in Processing container 12: 10 mTorr (1.333 Pa)
High Frequency Power for Generating Plasma: 200 W
High Frequency Bias Power: 800 W
Flow Rate of Nitrogen Gas: 50 sccm
Flow Rate of Neon Gas: 150 sccm
Temperature of Workpiece: 10° C.

Figure 5:
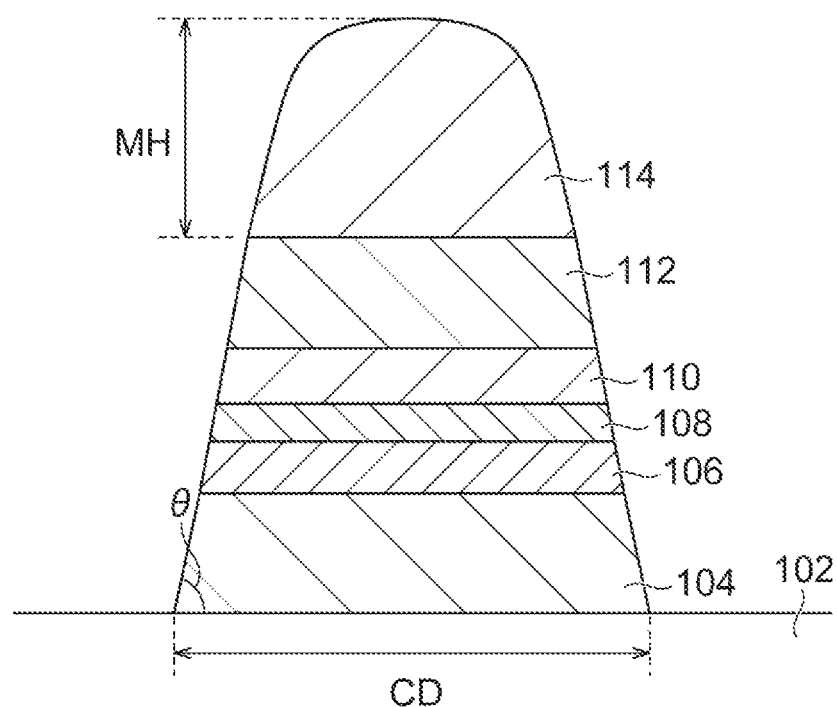
FIG. 5 is a diagram illustrating parameters of a shape.

An angle θ of the side wall surface of the multi-layer film ML etched in Test Example 1 and Comparative Test Example 1 was measured. As illustrated in FIG. 5, the angle θ is an angle θ between the side wall surface of the multi-layer film ML after being etched and the surface of the lower electrode 102. The measurement results will be described below.

Angle θ of Multi-Layer Film ML Obtained in Test Example 1: 83.34°

Angle of Multi-Layer Film ML Obtained Comparative Test Example 1: 29.84°

From the measurement result described above, it was confirmed that the verticality of the side wall surface of the multi-layer film ML after being etched could be considerably improved by using the first processing gas containing the helium gas which was rare gas, and the krypton gas having an atomic number larger than that of the helium gas, compared to Comparative Test Example 1 in which the first processing gas was not used.

[Evaluation of Film Thickness of Mask and Width of Multi-Layer Film]

Next, effectiveness of the step ST2 of the method MT was evaluated. As illustrated in FIG. 4, in Test Example 2, over etching was performed with respect to the workpiece W, in which the multi-layer film ML was etched to the surface of the lower electrode 102 by the step ST1, by using the plasma of the second gas. Then, a change in a film thickness MH of the upper layer 114 and a width CD of the multi-layer film ML with respect to an etching time was evaluated. Furthermore, as illustrated in FIG. 5, the film thickness MH is the thickness of the remaining upper layer 114 after being subjected to the over etching, and the width CD is a width of a bottom portion of the multi-layer film ML after being subjected to the over etching. The film thickness MH of the upper layer 114, and the width CD of the multi-layer film ML was 76 nm, before Test Example 2 was performed was 61 nm. In addition, processing conditions of Test Example 2 were as follows.

(Test Example 2)
Pressure in Processing container 12: 10 mTorr (1.333 Pa)
High Frequency Power for Generating Plasma: 200 W
High Frequency Bias Power: 800 W
Flow Rate of Methane Gas: 15 sccm
Flow Rate of Carbon Monoxide (CO) Gas: 43 sccm
Flow Rate of Neon Gas: 85 sccm
Flow Rate of Helium Gas: 57 sccm
Temperature of Workpiece: 10° C.

Figure 6:
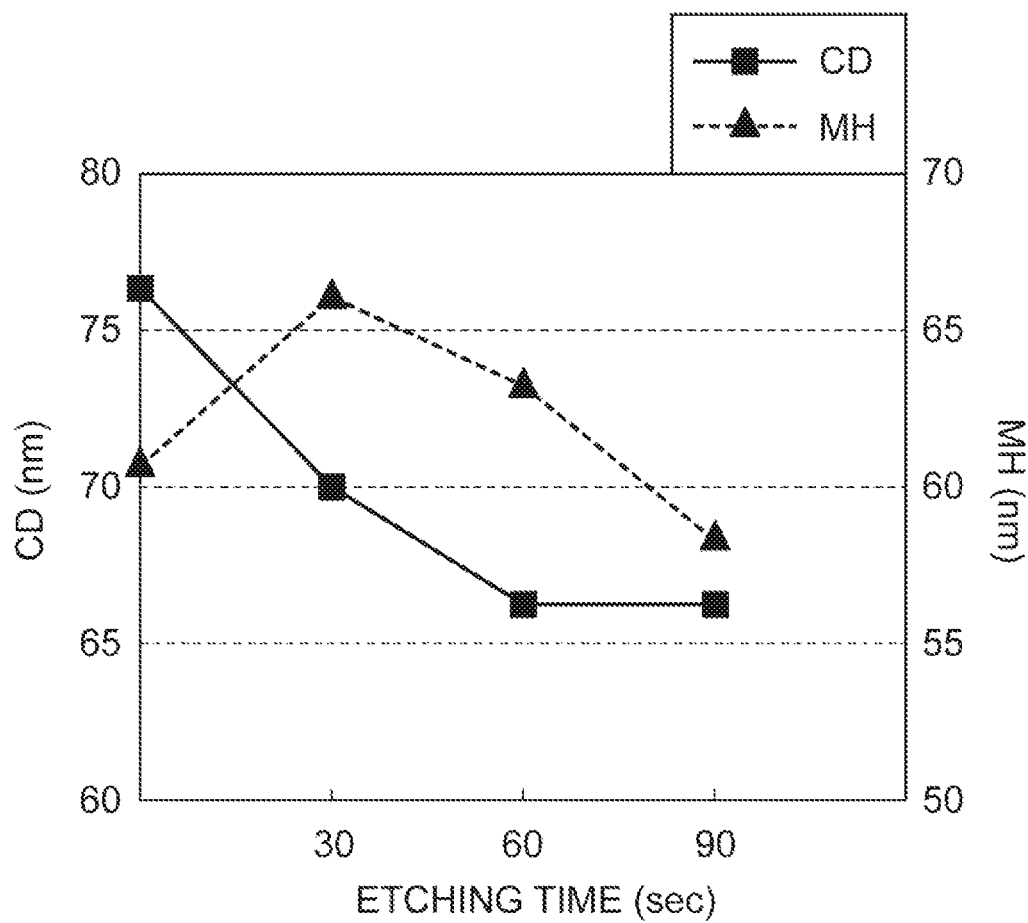
FIG. 6 is a graph illustrating a change in a film thickness of a mask and a width of a multi-layer film with respect to an etching time.

Refer to FIG. 6 FIG. 6 is a graph illustrating the change in the film thickness MH of the upper layer 114 and the width CD of the multi-layer film ML with respect to the etching time. Specifically, in FIG. 6, the film thickness MH and the width CD are measured at a time point of the etching times of 30 seconds, 60 seconds, and 90 seconds, and are plotted.

From the results illustrated in FIG. 6, it was confirmed that the width CD of the multi-layer film ML decreased as the etching time became longer. On the other hand, it was confirmed that the film thickness MH of the upper layer 114 tended to be maintained even in a case where the etching time became longer. For example, in a case where the etching time was 90 seconds, a decrease in the width CD was 10 nm, whereas a decrease in the film thickness MH was approximately 3 nm. From the result, it was confirmed that it is possible to decrease the width CD of the multi-layer film ML while suppressing a decrease in the film thickness of mask MK by etching the workpiece W by using the second gas containing helium and neon.

As described above, various embodiments have been described, but the present invention is not limited to the embodiments described above, and various modification embodiments can be configured. For example, in a case where it is not necessary to decrease the width CD of the multi-layer film ML, the step ST2 may not be performed. In addition, the workpiece to which the method MT is applied is not limited insofar as including the lower electrode, and the multi-layer film which is disposed on the lower electrode, and includes the first magnetic layer, the second magnetic layer, and the insulating layer interposed between the first magnetic layer and the second magnetic layer, and for example, a thin film different from the pinning layer, the first magnetic layer, the insulating layer, and the second magnetic layer may be included in the multi-layer film ML.

In addition, the first processing gas can further contain arbitrary gas insofar as containing the first rare gas and the second rare gas, and as not containing the hydrogen gas. Further, the second processing gas can further contain arbitrary gas insofar as containing the helium and the neon. In addition, in the embodiments described above, the multi-layer film ML is etched in the step ST1 of the method MT, but both of the upper electrode 112 and the multi-layer film ML may be etched together by using the upper layer 114 as a mask in the step ST1.

REFERENCE SIGNS LIST

10: plasma processing apparatus
12: processing container
102: lower electrode
104: pinning layer
106: first magnetic layer
108: insulating layer
110: second magnetic layer
112: upper electrode
114: upper layer
MK: mask
ML: multi-layer film

The invention claimed is:

1. A method for etching a workpiece including a lower electrode and a multi-layer film disposed on the lower electrode, the multi-layer film including a first magnetic layer, a second magnetic layer and an insulating layer interposed between the first magnetic layer and the second magnetic layer, through a mask, the method, comprising:
   exposing the workpiece to a plasma generated from a first processing gas, wherein the first processing gas contains a first rare gas and a second rare gas, wherein the second rare gas has an atomic number larger than that of the first rare gas, and wherein the first processing gas does not contain hydrogen gas; and
   exposing the workpiece to a plasma generated from a second processing gas, wherein the second processing gas contains helium and neon, and wherein the workpiece is exposed to the plasma generated from the second processing gas after the multi-layer film is etched and a surface of the lower electrode is exposed as a result of exposing the workpiece to the plasma generated from the first processing gas.

2. The method according to claim 1,
   wherein the first processing gas and the second processing gas further contain methane gas.

3. The method according to claim 1,
   wherein the multi-layer film further includes a pinning layer which is disposed between the lower electrode and the first magnetic layer.

4. The method according to claim 3,
   wherein the first magnetic layer and the second magnetic layer are configured of CoFeB,
   the insulating layer is configured of MgO, and
   the pinning layer is configured of CoPt.

5. The method according to claim 1,
   wherein the mask contains Ta.

6. The method according to claim 1,
   wherein the first rare gas is helium or neon, and
   the second rare gas is any one of argon, krypton, and xenon.

7. The method according to claim 1,
   wherein the first rare gas is helium, and
   the second rare gas is krypton.

8. A method for etching a workpiece having a mask and a multi-layer film disposed on a lower electrode, the method comprising:
   exposing the workpiece to a first plasma generated from a first processing gas to etch the multi-layer film until a surface of the lower electrode is at least partially exposed; and
   exposing the workpiece, including the partially exposed surface of the lower electrode, to a second plasma generated from a second processing gas, wherein the second processing gas comprises helium and neon,
   wherein the multi-layer film comprises a first magnetic layer, a second magnetic layer and an insulating layer interposed between the first magnetic layer and the second magnetic layer, and wherein the multi-layer film is etched through the mask.

9. The method according to claim 8, wherein the first processing gas comprises substantially no hydrogen gas.

10. The method according to claim 9, wherein the first processing gas comprises a first rare gas and a second rare gas, and wherein the second rare gas has an atomic number larger than that of the first rare gas.

11. The method according to claim 8, wherein the first processing gas comprises methane gas.

12. The method according to claim 8, wherein the second processing gas further comprises methane gas.

\* \* \* \* \*